(12) United States Patent
Crevasse et al.

(10) Patent No.: US 6,423,149 B1
(45) Date of Patent: Jul. 23, 2002

(54) APPARATUS AND METHOD FOR GRADIENT CLEANING OF SEMICONDUCTOR WAFERS

(75) Inventors: Annette M. Crevasse, Apopka; William G. Easter, Orlando; John A. Maze, Clermont; Frank Miceli, Orlando, all of FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/532,688

(22) Filed: Mar. 22, 2000

(51) Int. Cl.[7] ................................................. B08B 1/02
(52) U.S. Cl. ........................ 134/6; 134/7; 134/32; 134/902; 134/25.4; 15/77; 15/88.3; 15/102
(58) Field of Search ............................. 134/6, 7, 902, 134/32; 15/77, 88.3, 102

(56) References Cited

U.S. PATENT DOCUMENTS

| | | | | |
|---|---|---|---|---|
| 6,059,888 A | * | 5/2000 | Hillman | 134/6 |
| 6,070,284 A | * | 6/2000 | Garcia et al. | 15/102 |
| 6,174,820 B1 | * | 1/2001 | Habermehl et al. | 438/745 |

* cited by examiner

Primary Examiner—Zeinab El-Arini

(57) ABSTRACT

The present invention provides in one embodiment a method of manufacturing an integrated circuit including cleaning a semiconductor wafer using a cleaning apparatus, wherein the cleaning apparatus includes a roller brush frame and roller brushes cooperatively supported within the roller brush frame and aligned to form a cleaning gradient that is configured to remove particles of different sizes from an object to be cleaned. In another embodiment, each of the roller brushes has

6 Claims, 3 Drawing Sheets

APPARATUS AND METHOD FOR GRADIENT CLEANING OF SEMICONDUCTOR WAFERS

TECHNICAL FIELD OF THE INVENTION

The present invention is directed, in general, to semiconductor wafer processing and, more specifically, to an apparatus and method for improved cleaning of post-CMP (chemical/mechanical planarization) semiconductor wafers.

BACKGROUND OF THE INVENTION

In the manufacture of integrated circuits (ICs), chemical/mechanical polishing (CMP) is used to provide smooth topographies of semiconductor wafer substrates on which the ICs are formed for subsequent lithography and material deposition. These CMP processes are well known within the IC fabrication industry.

One problem area associated with CMP is in the area of cleaning debris from the semiconductor wafers in the post-CMP environment. During CMP, at least some portions of the semiconductor wafer are abraded and may remain as debris on the wafer surfaces. This debris can damage the integrated circuits on the wafer and must be removed before subsequent processing. Conventional approaches include the use of open-cell plastic foam brushes, usually comprising polyvinyl alcohol, and a solvent to clean the wafers. Multiple brushes, often oriented to simultaneously clean both sides of the semiconductor wafer, are also used. The cleaning device is usually equipped with adjustments allowing the amount of contact and the pressure between the wafer and the brush to be controlled. A consistent cell or pore size within a single brush is generally achieved by foaming the plastic in the presence of a gas or liquid. Pore size directly affects the ability of the brush to remove particles from the semiconductor wafer. For example, a relatively small pore size is generally not very effective in removing larger particles from the semiconductor wafer; that is, the larger particles simply are not captured by small pores. Likewise, large pores have a tendency not to retain the smaller particles. The cleaning brushes used are generally those recommended by the equipment manufacturer without much further consideration. Therefore, using a single pore size for all of the brushes is effective for one range of particles and may miss a significant number of particles of other sizes.

A solvent is usually also used with the foam brushes to assist in the cleaning. This maintains a consistent level of resiliency in the foam. The brush may also be formed with ridges or knobs rather than a smooth surface. However, these variations in the brushes surface shape have not been shown to be significant in changing the cleaning effectiveness of the brush.

Accordingly, what is needed in the art is an apparatus and method of using such an apparatus that more effectively removes particulate debris remaining after CMP of a semiconductor wafer.

SUMMARY OF THE INVENTION

To address the above-discussed deficiencies of the prior art, the present invention provides in one embodiment a method of manufacturing an integrated circuit including cleaning a semiconductor wafer using a cleaning apparatus comprising a roller brush frame and roller brushes cooperatively supported within the roller brush frame and aligned to form a cleaning gradient; the cleaning gradient configured to remove particles of different sizes from an object to be cleaned. In another embodiment, each of the roller brushes has a different pore size associated therewith; the different pore sizes thereby forming the cleaning gradient.

In another embodiment, the roller brushes are a first set of roller brushes aligned to form a first cleaning plane and the cleaning apparatus further comprises a second set of roller brushes to form a second cleaning plane opposing the first cleaning plane. The second set of roller brushes have different pore sizes corresponding to the different pore sizes of the first set of roller brushes.

In an alternative embodiment, the first and second cleaning planes are substantially parallel and the first and second sets of roller brushes are aligned such that like pore sizes of the first and second sets of roller brushes oppose each other. In a further aspect, the roller brush frame further comprises axle apertures wherein the axle apertures are configured to permit independent adjustment of a distance between opposing roller brushes.

The roller brushes, in another embodiment, may comprise an open-celled brush material, such as an open-celled foamed plastic. In a specific aspect of this embodiment, the open-celled plastic is polyvinyl alcohol. In yet another embodiment, the roller brush frame further comprises load cells couplable to the roller brushes. In a further aspect, the load cells are adjustable load cells. In another embodiment, the cleaning apparatus further comprises a solvent dispenser coupled to the roller brush frame and configured to dispense a solvent to the roller brushes.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
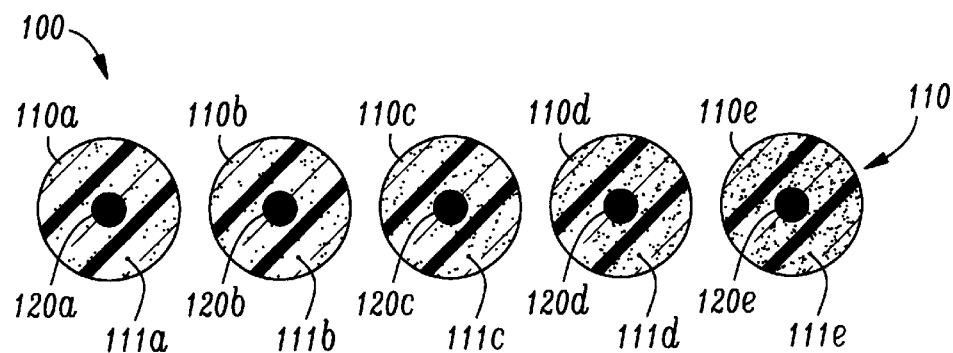
FIG. 1 illustrates sectional views of a plurality of roller brushes constructed according to the principles of the present invention.

Referring initially to FIG. 1, illustrated is an end view of a plurality of roller brushes 100 constructed according to the principles of the present invention. In the illustrated embodiment, the plurality of roller brushes 100 comprise five roller brushes, 110a–110e, each comprising an open-celled plastic foam, e.g., polyvinyl alcohol (PVA), and having a different pore size 111a–111e and an axle 120a–120e. More specifically, the first roller brush 110a may have a pore size 111a designed to remove particles of about 1000 nm and larger. The second roller brush 110a may have a pore size 111b suitable to remove particles from about 700 nm to 1000 nm, while the third roller brush 110c has a smaller pore size 111c suitable for removing particles from about 400 nm to 700 nm. The fourth and fifth roller brushes 110d, 110e have yet smaller pore sizes 111d, 111e designed to remove particles from about 100 nm to about 400 nm and particles less than 100 nm, respectively. The different pore sizes 111a–111e associated with the plurality of roller brushes 110a–110e form a cleaning gradient. One having skill in the art knows that the pore sizes of the brushes is not limited to those described above and that brushes having smaller or larger pore sized could be used if needed. Furthermore, the material of the roller brushes need not be limited to PVA, but rather other open-celled plastics may be used if the desired pore size can be obtained.

Figure 2:
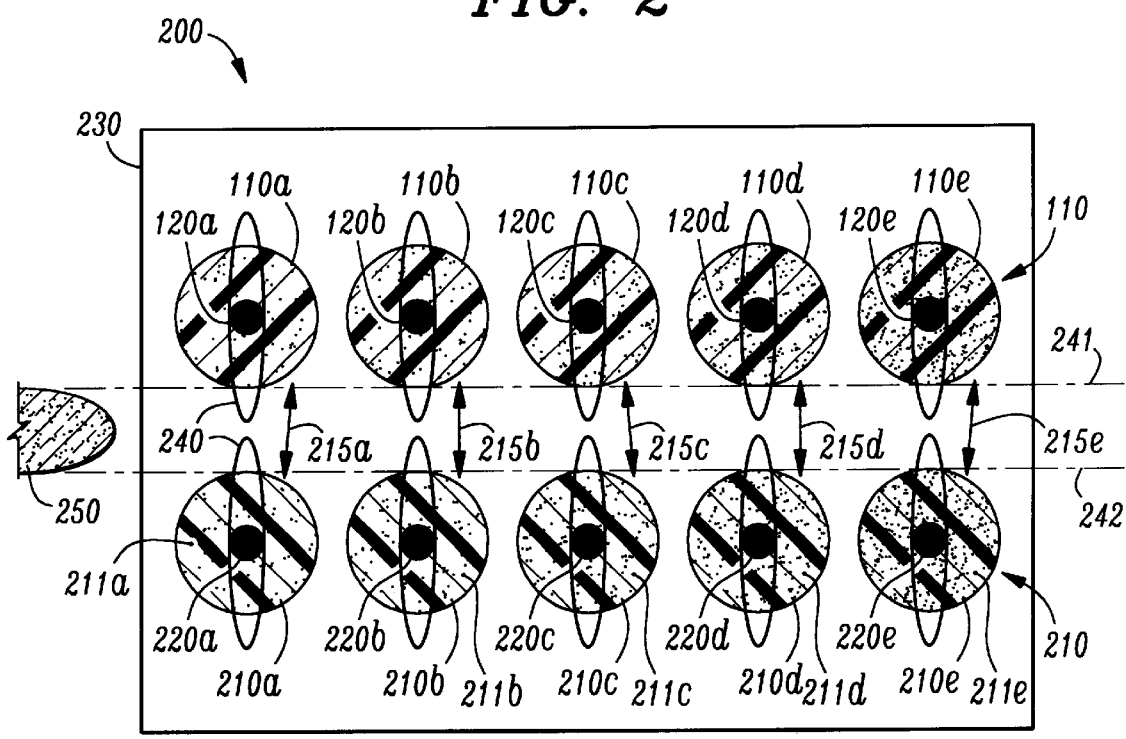
FIG. 2 illustrates an elevational view of one embodiment of a semiconductor wafer cleaning apparatus employing the roller brushes of FIG. 1 and constructed according to the principles of the present invention.

Referring now to FIG. 2, illustrated is an end view of one embodiment of a semiconductor wafer cleaning apparatus 200 employing the roller brushes 110a–110e of FIG. 1 and constructed according to the principles of the present invention. The semiconductor wafer cleaning apparatus 200 comprises roller brushes, collectively designated 110 and having axles 120a–120e, respectively, a second set of roller brushes, collectively designated 210 and having axles 220a–220e, respectively, and a roller brush frame 230 having a plurality of pairs of axle apertures, collectively designated 240.

Each of the roller brushes 110a–110e has a different pore size 111a–111e associated therewith as described above. In the illustrated embodiment, five roller brushes 110a–110e are aligned such that the roller brushes 110 form the cleaning gradient, 110a through 110e. Furthermore, the roller brushes 110 are aligned to form a first cleaning plane 241. The second set of roller brushes 210 form a second cleaning plane 242 and are in opposition to the first set of roller brushes 110. The first and second cleaning planes 241, 242 are substantially parallel. Of course, the second set of roller brushes 210a–210e have different pore sizes 211a–211e corresponding to the different pore sizes 111a–111e of the first set of roller brushes 110 so that a semiconductor wafer 250 may pass progressively between pairs of roller brushes 110a and 210a, 110b and 210b, 110c and 210c, 110d and 210d, finally passing between brush pair 110e and 210e. Thus, in the illustrated example the semiconductor wafer 250 is subjected to progressively finer pore sizes 111a–111e and 211a–211e to effectively remove ever smaller particles. It should be noted that the semiconductor wafer 250 must not always be subjected to progressively finer pore sizes, and that if required by design the brushes could progressively increase in pore size. It should also be noted that exactly five rollers are not always required. A fewer or greater number of rollers may be used if the design of the device requires so.

The axles 120a–120e, 220a–220e of each roller brush 110a–110e, 210a–210e are inserted and aligned into a suitable pair of axle apertures 240. Each of the roller brushes 110a–110e, 210a–210e may be independently adjusted so as to establish individual desired distances 215a–215e between opposing roller brushes 110a–110e, 210a–210e. It should also be noted that the rotational direction and rotational speeds of the individual brushes 110a–110e, 210a, 210e may be independently controlled for optimal results. That is, some brushes may rotate in a clockwise direction and at a first rotational speed, while another brush or brushes may rotate in a counter-clockwise direction at other rotational speeds.

Figure 3:
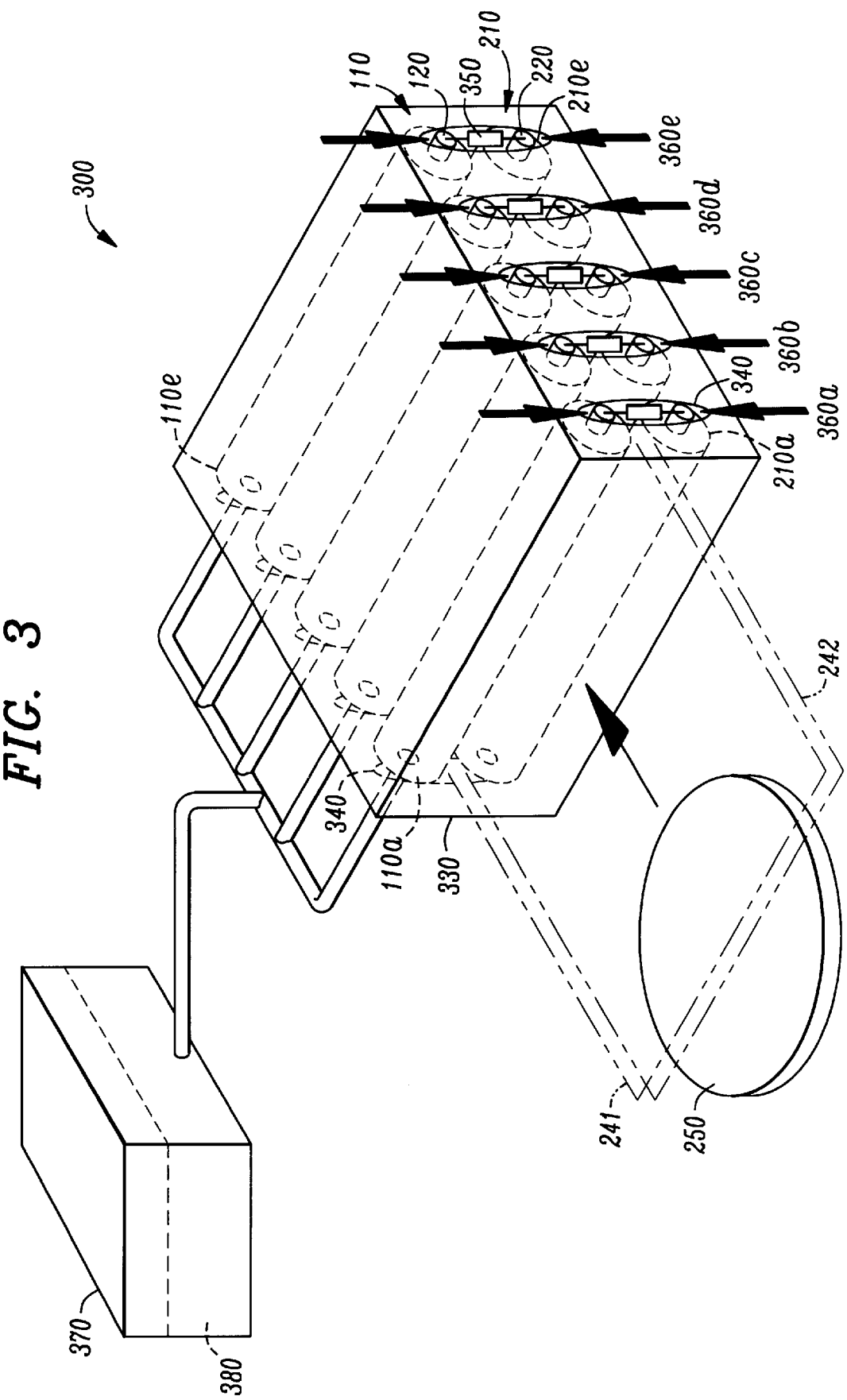
FIG. 3 illustrates an alternative embodiment of the cleaning apparatus of FIG. 2.

Referring now to FIG. 3, illustrated is a perspective view of an alternative embodiment of the cleaning apparatus of FIG. 2. In this embodiment, a semiconductor cleaning apparatus 300 comprises first and second sets of roller brushes 110, 210 having axles 120, 220, respectively, a roller brush frame 330 having pairs of axle apertures 340, load cells 350, and a solvent dispenser 370 containing solvent 380.

The first and second sets of roller brushes 110, 210 are slidably coupled to the roller brush frame 330 at the axles 120, 220, respectively, in the axle apertures 340. The load cells 350 individually couple to opposing sets, e.g., 110a and 210a, of roller brushes 110, 210 at the axles 120, 220 to control a force 360a–360e applied to the semiconductor wafer 250 being cleaned. Of course, the load cells 350 may be pneumatically or hydraulically operated as well as being individually adjustable for the forces 360a–360e applied. Thus, the amount of force 360, and therefore deformation of the roller brushes 110, 210 and contact with the semiconductor wafer 250 may be controlled.

The solvent dispenser 370 is configured to dispense the selected solvent 380 that assists in cleaning of the semiconductor wafer 250 and maintains the resiliency of the roller brushes 110, 210. One who is skilled in the art is familiar with such solvent dispensers and the solvents used for cleaning semiconductor wafers.

In operation, the solvent dispenser 370 delivers the cleaning solvent 380 to the roller brushes 110, 210 thereby maintaining the brush resiliency and assisting cleaning of the semiconductor wafer 250. The semiconductor wafer 250 is fed into the cleaning apparatus 300 between the first and second cleaning planes 241, 242. As the semiconductor wafer 250 proceeds from roller brushes 110a, 210a through to roller brushes 110e, 210e, progressively smaller particles are removed from the surface of the semiconductor wafer 250. Clearly, the present invention may also be used for cleaning other objects that lend themselves to a series of cleaning brushes comprising progressively finer pore sizes for improved cleaning.

Figure 4:
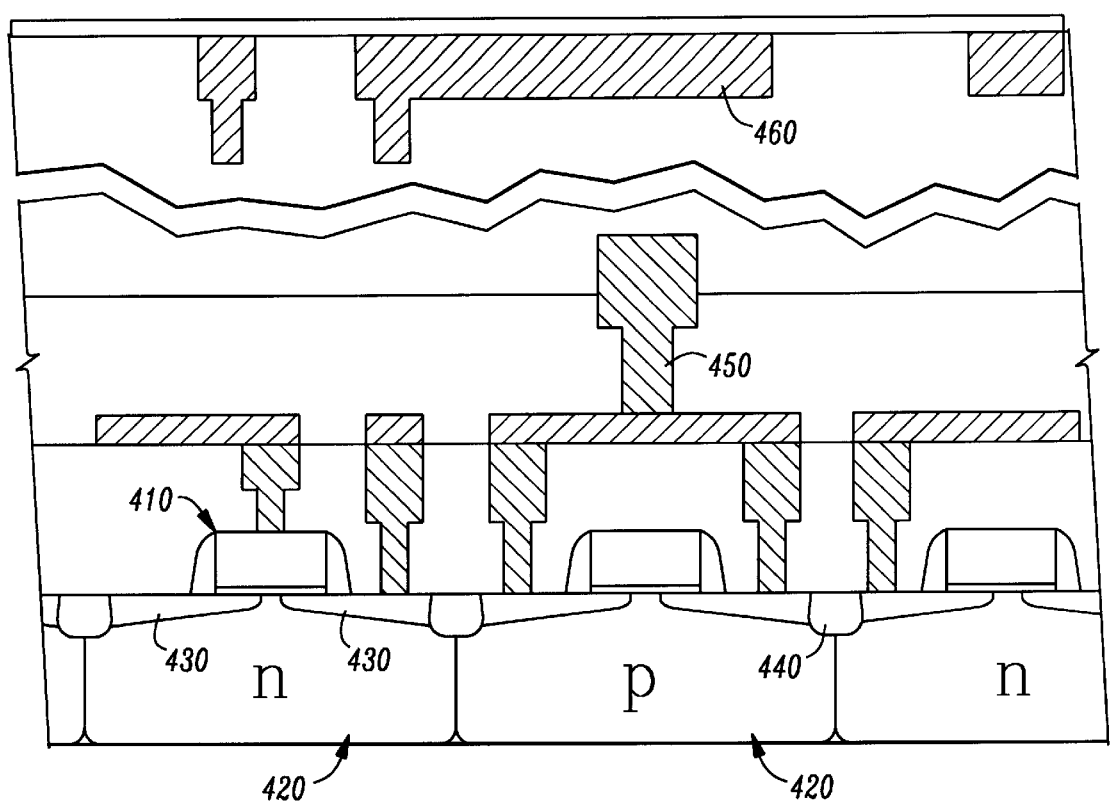
FIG. 4 illustrates a partial sectional view of a conventional integrated circuit that can be manufactured using a semiconductor wafer cleaning apparatus constructed in accordance with the principles of the present invention.

Referring now to FIG. 4, illustrated is a sectional view of a conventional integrated circuit 400 that can be manufactured using a semiconductor wafer cleaning apparatus constructed in accordance with the principles of the present invention. In one embodiment, a method of manufacturing the integrated circuit 400 may include forming an active device 410 on a semiconductor wafer, polishing a substrate of the semiconductor wafer with a slurry; and cleaning the substrate with a cleaning apparatus that may be similar to those shown in FIGS. 2 and 3. The cleaning apparatus may include a roller brush frame and roller brushes cooperatively supported within the roller brush frame and aligned to form a cleaning gradient, the cleaning gradient configured to remove particles of different sizes from the substrate, wherein each of the roller brushes has a different pore size associated therewith, the different pore sizes forming the cleaning gradient. In the particular sectional view shown in FIG. 4, there is illustrated an active device 410 that comprises tub regions 420, source/drain regions 430 and field oxides 440, which together may form a conventional transistor, such as a CMOS, PMOS, NMOS or bi-polar transistor. A contact plug 450 contacts the active device 410. The contact plug 450 is, in turn, contacted by an interconnect 460 that connects to other regions of the integrated circuit

400 all of which are not shown. Those who are skilled in the art are very familiar with such transistor devices in both structure and methods of fabrication thereof.

Thus, a cleaning apparatus has been described that removes progressively smaller particles from the surfaces of a semiconductor wafer by optimizing a series of paired, opposing roller brushes having different pore sizes specifically designed to remove a band size of particles. The present invention improves the cleanliness of semiconductor wafers in the post-CMP environment, thereby improving production yield. The invention may also be used with other objects, for example sheet glass, that lend themselves to such progressive cleaning principles.

Although the present invention has been described in detail, those skilled in the art should understand that they can make various changes, substitutions and alterations herein without departing from the spirit and scope of the invention in its broadest form.

What is claimed is:

1. A method of manufacturing an integrated circuit, comprising:

forming an active device on a semiconductor wafer;

polishing a substrate of the semiconductor wafer with a slurry; and cleaning the substrate with a cleaning apparatus comprising:

a roller brush frame; and roller brushes cooperatively supported within the roller brush frame and aligned to form a cleaning gradient, the cleaning gradient configured to remove particles of different sizes from the substrate, wherein each of the roller brushes has a different pore size associated therewith, the different pore sizes forming the cleaning gradient.

2. The method as recited in claim 1 wherein the roller brushes comprise a first set of roller brushes aligned to form a first cleaning plane and a second set of roller brushes aligned to form a second cleaning plane opposing the first cleaning plane, the second set of roller brushes having different pore sizes corresponding to the different pore sizes of the first set of roller brushes.

3. The method as recited in claim 2 wherein the first and second cleaning planes are substantially parallel and the first and second sets of roller brushes are aligned such that like pore sizes of the first and second sets of roller brushes oppose each other, and the roller brush frame further comprises axle apertures configured to permit independent adjustment of a distance between opposing roller brushes.

4. The method as recited in claim 1 wherein the cleaning apparatus configured to clean a semiconductor wafer.

5. The method as recited in claim 1 wherein the roller brushes comprise an open-celled brush material.

6. The method as recited in claim 5 wherein the roller brushes comprise polyvinyl alcohol.

* * * * *